United States Patent
Glenn

(10) Patent No.: US 6,534,876 B1
(45) Date of Patent: Mar. 18, 2003

(54) FLIP-CHIP MICROMACHINE PACKAGE

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 80 days.

(21) Appl. No.: 09/608,298

(22) Filed: Jun. 30, 2000

(51) Int. Cl.[7] ............................................. H01L 29/40
(52) U.S. Cl. ..................... 257/778; 257/693; 257/702
(58) Field of Search ................................ 257/693, 698, 257/702, 724, 777, 778, 779; 359/802, 804, 819, 821; 438/107, 111, 112

(56) References Cited

U.S. PATENT DOCUMENTS

| | | | | |
|---|---|---|---|---|
| 5,583,376 A | * | 12/1996 | Sickler et al. | 257/702 |
| 5,610,431 A | | 3/1997 | Martin | 257/415 |
| 5,719,069 A | | 2/1998 | Sparks | 437/59 |
| 5,898,220 A | * | 4/1999 | Ball | 257/723 |
| 5,915,168 A | | 6/1999 | Salatino et al. | 438/110 |
| 6,074,891 A | | 6/2000 | Staller | 438/53 |
| 6,084,297 A | * | 7/2000 | Brooks et al. | 257/698 |
| 6,084,308 A | * | 7/2000 | Kelkar et al. | 257/777 |
| 6,258,626 B1 | * | 7/2001 | Wang et al. | 438/107 |
| 6,266,197 B1 | * | 7/2001 | Glenn et al. | 359/819 |

* cited by examiner

*Primary Examiner*—David Nelms
*Assistant Examiner*—Dao H. Nguyen
(74) *Attorney, Agent, or Firm*—Gunnison, McKay & Hodgson, L.L.P.; Serge J. Hodgson

(57) ABSTRACT

A micromachine package includes a micromachine chip mounted as a flip chip to a substrate. The micromachine chip includes a micromachine area and bond pads formed on a front surface of the micromachine chip. The substrate includes traces formed on an upper surface of the substrate. The bond pads are coupled to the traces by bumps, e.g., formed of solder. The micromachine package is sealed with a package body formed from a cured limited flow liquid encapsulant to protect the micromachine area from the ambient environment. More particularly, the micromachine chip, the package body and the substrate define a sealed cavity, and the micromachine area is located within the sealed cavity.

22 Claims, 5 Drawing Sheets

FLIP-CHIP MICROMACHINE PACKAGE

BACKGROUND OF THE INVENTION

1. Field of the Invention

The present invention relates generally to the packaging of electronic components. More particularly, the present invention relates to a micromachine package.

2. Description of the Related Art

Micromachine sensing elements (hereinafter micromachine elements) are well known. A micromachine element typically includes a miniature moveable structure, such as a bridge, cantilevered beam, suspended mass, membrane or capacitive element, which is supported over a cavity formed in a silicon wafer. Since the operation of the micromachine element depends upon the moveability of the miniature moveable structure, it is critical that the package, which includes the micromachine element, does not contact the miniature moveable structure in any manner.

FIG. 1 is a cross-sectional view of a structure 8 during the formation of a plurality of micromachine packages in accordance with the prior art. As shown in FIG. 1, a silicon wafer 10 included a plurality of micromachine chips 12. Micromachine chips 12 included micromachine areas 14 on a front surface 10F of wafer 10. Micromachine areas 14 included the miniature moveable structure of the micromachine element. Micromachine chips 12 further included bond pads 16 on front surface 10F of wafer 10. Bond pads 16 were connected to the internal circuitry of micromachine chips 12.

Micromachine chips 12 were often integrally connected together in an array. Each of micromachine chips 12 in the array was delineated by a singulation street 20, which was located between adjacent micromachine chips 12.

A lid 30 was positioned above wafer 10. Lid 30 included a plurality of caps 42 integrally connected to one another. Each cap 42 included a micromachine cavity 32. Each micromachine cavity 32 was positioned over a corresponding micromachine area 14. Generally, micromachine cavities 32 were wider than micromachine areas 14.

Each cap 42 further included a bond pad cavity 34. Each bond pad cavity 34 was positioned over a corresponding set of bond pads 16 on a micromachine chip 12. Generally, bond pad cavities 34 were wider than bond pads 16, and were at least as deep as bond pads 16 were tall.

FIG. 2A is a cross-sectional view of structure 8 of FIG. 1 at a further stage in fabrication in accordance with the prior art. As shown in FIG. 2A, lid 30 was attached to wafer 10. Micromachine cavities 32 were positioned above corresponding micromachine areas 14. Further, bond pad cavities 34 were positioned above corresponding sets of bond pads 16.

FIG. 2B is a cross-sectional view of structure 8 of FIG. 2A at a further stage of fabrication in accordance with the prior art. Referring to FIG. 2B, a series of shallow cuts were made to remove a portion of each cap 42 to expose bond pads 16. Micromachine chips 12 were electrically tested by connecting test probes to bond pads 16. If testing of a micromachine chip 12 indicated that the micromachine chip 12 was defective, the micromachine chip 12 and/or corresponding cap 42 was marked. For example, micromachine chip 12A was marked as being defective. Wafer 10 was then singulated along singulation streets 20. Micromachine chips 12 which were marked as defective were discarded.

Disadvantageously, a cap 42 was attached to a micromachine chip 12 even if the micromachine chip 12 was defective. The cap 42 and defective micromachine chip 12 were discarded. However, since a cap 42 was attached to the defective micromachine chip 12, the cost associated with the defective micromachine chip 12 was increased compared to the cost associated with the defective micromachine chip 12 alone. This increased the cost of fabricating each batch of micromachine packages. This, in turn, increased the average total cost of fabricating each individual micromachine package, which passed testing.

After singulation of wafer 10, each good micromachine chip 12 with cap 42 was further packaged. FIG. 3 is a cross-sectional view of a single micromachine package 40 in accordance with the prior art. As shown in FIG. 3, micromachine chip 12 and cap 42 were attached to a substrate 52. Bond pads 16 were electrically connected to traces 44 by bond wires 46. To prevent accumulation of static charge on cap 42, which would render micromachine chip 12 inoperable, cap 42 was electrically connected to a ground trace 48 by a bond wire 50. Ground trace 48 was grounded during use. Although effective at prevent accumulation of static charge on cap 42, grounding cap 42 by electrically connecting cap 42 to ground through bond wire 50 and ground trace 48 was relatively labor intensive and complex which increased the cost of fabricating package 40.

SUMMARY OF THE INVENTION

In accordance with the present invention, a micromachine package includes a micromachine chip mounted as a flip chip to a substrate. The micromachine chip includes a micromachine area and bond pads formed on a front surface of the micromachine chip. The substrate includes traces formed on an upper surface of the substrate. The bond pads are coupled to the traces by bumps, e.g., formed of solder.

Advantageously, the micromachine package is sealed with a package body formed from a cured limited flow liquid encapsulant to protect the micromachine area from the ambient environment. More particularly, the micromachine chip, the package body and the substrate define a cavity, and the micromachine area is located within the cavity.

Recall that in the prior art, the cap was mounted over the micromachine area. Advantageously, by mounting the micromachine chip as a flip chip to the substrate in accordance with the present invention, the requirement for the cap utilized in the prior art is eliminated. By eliminating the cap, the materials and labor associated with manufacturing and installing the cap are also eliminated. Further, since the requirement for the cap is eliminated, the requirement for grounding the cap is also eliminated.

In one embodiment, the limited flow liquid encapsulant is applied in an edge fill configuration for situations requiring a thinner package. In an edge fill configuration, the limited flow liquid encapsulant contacts sides of the micromachine chip.

In another embodiment, a partial overfill configuration is used for those situations having less restriction on total component height. In a partial overfill configuration, the limited flow liquid encapsulant contacts sides of the micromachine chip and extends over at least a portion of a back surface of the micromachine chip.

In yet another embodiment, a full overfill configuration is provided for those situations having little or no restriction on total component height. In a full overfill configuration, the limited flow liquid encapsulant contacts sides of the micromachine chip and extends over and covers the entire back surface of the micromachine chip.

External connectivity configurations, such as a ball grid array (BGA), leadless chip carrier (LCC), or land grid array (LGA) configurations, are provided which are contemplated to be implemented in combination or separate from the embodiments previously described.

Also in accordance with the present invention, a method of fabricating a flip chip micromachine package includes attaching a micromachine chip as a flip chip to a substrate. The micromachine chip has a micromachine area on a front surface of the micromachine chip. The method further includes dispensing a limited flow material, e.g., liquid encapsulant, around the micromachine chip. The limited flow material is cured to form a package body. The micromachine chip, the package body, and the substrate define a cavity, the micromachine area being located within the cavity.

Advantageously, only a micromachine chip which has been tested and found to operate correctly is attached to the substrate. In this manner, waste of the substrate is avoided and labor associated with attaching a defective micromachine chip thereto is saved.

Recall that in the prior art, a single lid was attached to a plurality of micromachine chips while still in wafer form. Thus, in the prior art, a cap was attached to each micromachine chip even if the micromachine chip was defective. Accordingly, caps and labor associated with attaching caps to the defective micromachine chips were wasted in the prior art. Since this waste of the prior art is eliminated, the micromachine package in accordance with the present invention is less expensive to manufacture than a micromachine package of the prior art.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with same or similar reference numbers.

DETAILED DESCRIPTION

Figure 1:
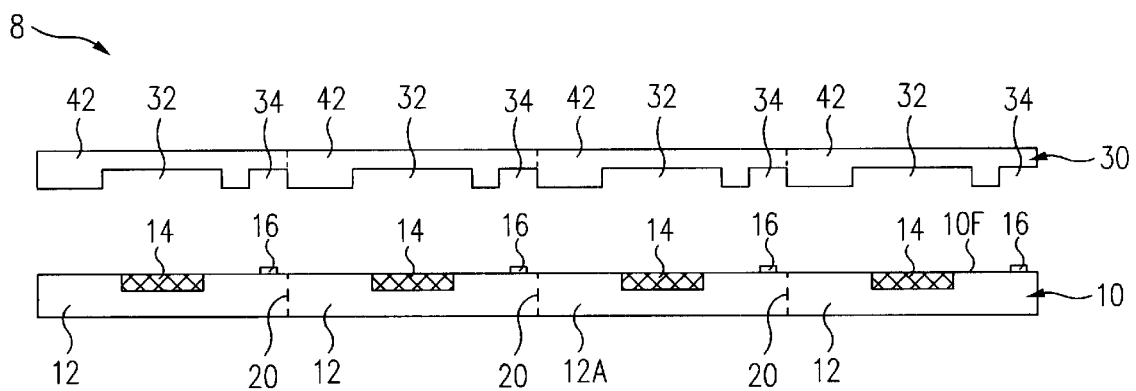
FIG. 1 is a cross-sectional view of a structure during the formation of a plurality of micromachine packages in accordance with the prior art.

In accordance with the present invention, a micromachine package 400 (FIG. 4) includes a micromachine chip 402 mounted as a flip chip to a substrate 408. Micromachine chip 402 includes a micromachine area 404 and bond pads 406 on a front surface 402F of micromachine chip 402. Substrate 408 includes traces 410 formed on an upper surface 408U of substrate 408. Bond pads 406 are coupled to traces 410 by bumps 412, e.g., formed of solder.

Advantageously, micromachine package 400 is sealed with a package body 424 formed from a cured limited flow liquid encapsulant to protect micromachine area 404 from the ambient environment. More particularly, micromachine chip 402, package body 424 and substrate 408 define a cavity 426, and micromachine area 404 is located within cavity 426.

Recall that in the prior art, a cap was mounted over the micromachine area. Advantageously, by mounting micromachine chip 402 as a flip chip to substrate 408 in accordance with the present invention, the requirement for the cap utilized in the prior art is eliminated. By eliminating the cap, the materials and labor associated with manufacturing and installing the cap are also eliminated. Further, since the requirement for the cap is eliminated, the requirement for grounding the cap is also eliminated.

Figure 7:
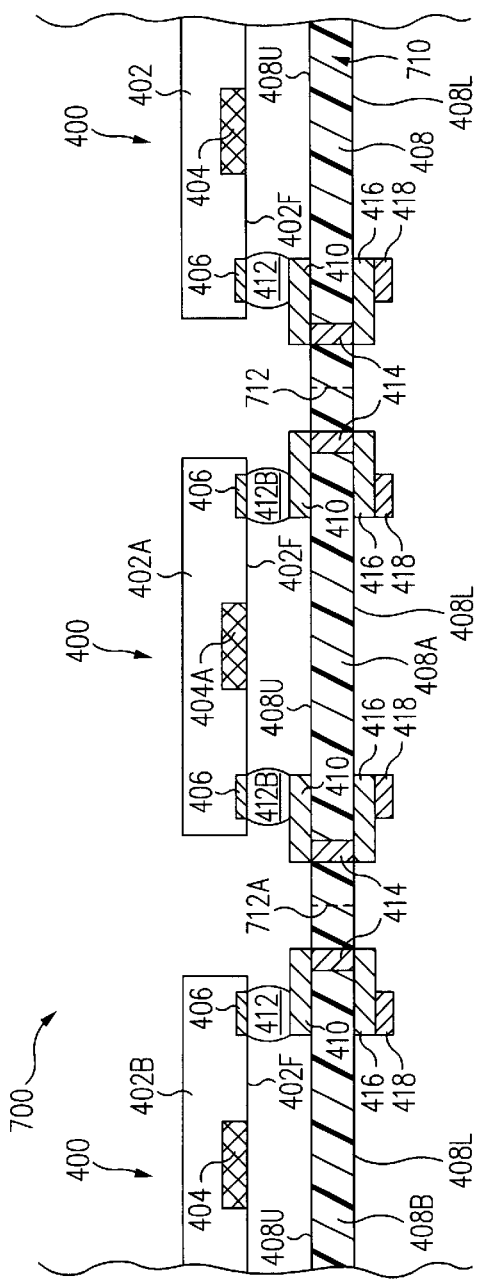
FIG. 7 is a cross-sectional view of an array of micromachine packages during assembly in accordance with the present invention.

Also in accordance with the present invention, referring now to FIG. 7, a method of fabricating a plurality of micromachine packages in an array 700 includes attaching micromachine chips 402 as flip chips to a micromachine substrate 710. Micromachine chips 402 have micromachine areas 404 on front surfaces 402F of micromachine chips 402. The method further includes (FIG. 8) dispensing a limited flow material, e.g., liquid encapsulant, around micromachine chips 402. The limited flow material is cured to form package bodies 424. Micromachine substrate 710 is populated (FIG. 9) with interconnection balls 420 on corresponding pads 418. Array 700 is singulated along singulation streets 712 resulting in a plurality of individual micromachine packages 400 (FIG. 4).

Advantageously, only micromachine chips 402 which have been tested and found to operate correctly are attached to micromachine substrate 710. In this manner, waste of substrates 408 of micromachine substrate 710 is avoided and labor associated with attaching micromachine chips 402, which are defective, thereto is saved. This, in turn, minimizes the total average cost associated with the fabrication of each batch of micromachine packages 400.

Figure 2A:
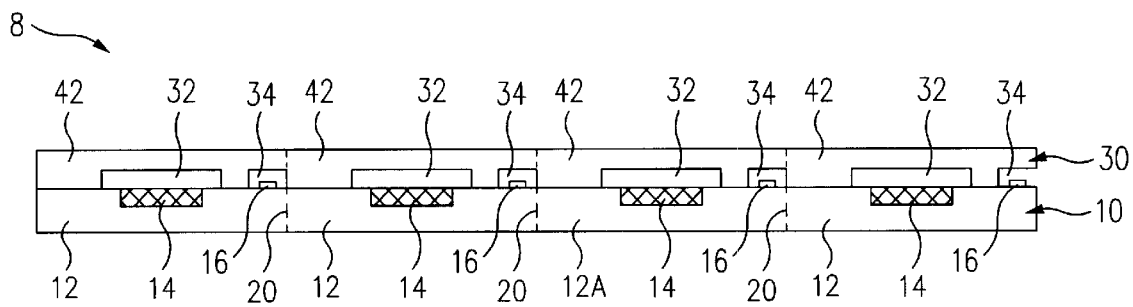
FIG. 2A is a cross-sectional view of the structure of FIG. 1 at a further stage in fabrication in accordance with the prior art.
Figure 2B:
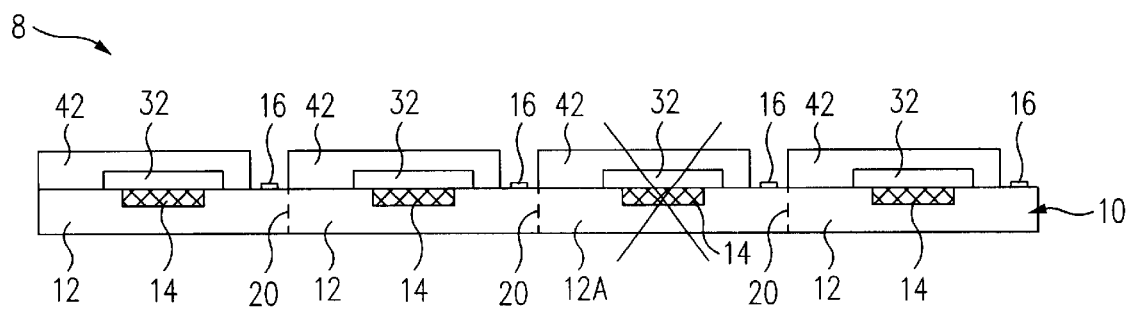
FIG. 2B is a cross-sectional view of the structure of FIG. 2A at a further stage in fabrication in accordance with the prior art.
Figure 3:
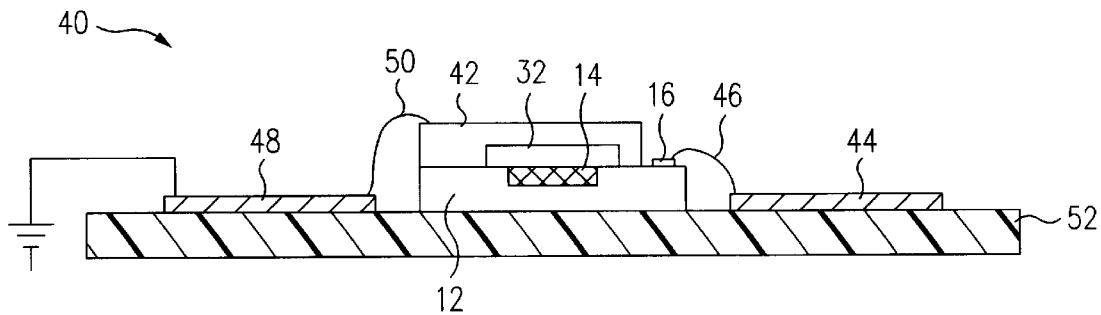
FIG. 3 is a cross-sectional view of a single micromachine package in accordance with the prior art.

Recall that in the prior art, a single lid 30 was attached to a plurality of micromachine chips 12 while still in wafer form (FIGS. 1, 2A). Thus, in the prior art, a cap 42 was attached to each micromachine chip 12 even if the micromachine chip was defective. Accordingly, caps 42 and labor associated with attaching caps 42 to the defective micromachine chips 12 were wasted in the prior art. Since this waste of the prior art is eliminated, micromachine package 400 in accordance with the present invention is less expensive to manufacture than a micromachine package of the prior art.

Figure 4:
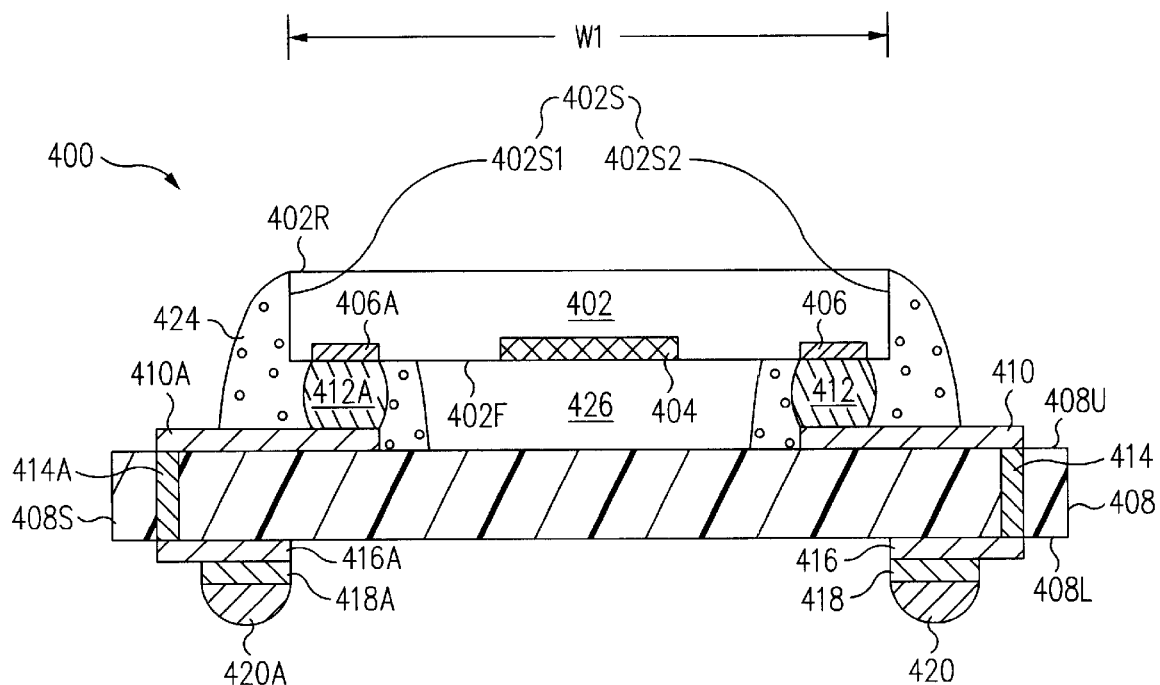
FIG. 4 is a cross-sectional view of a micromachine package in accordance with the present invention.

More particularly, FIG. 4 is a cross-sectional view of a micromachine package 400 (hereinafter package 400) in accordance with the present invention. Referring to FIG. 4, package 400 includes a micromachine chip 402 having a front, e.g., first, surface 402F and a rear, e.g., second, surface 402R. A micromachine area 404 is formed on front surface 402F and contains a micromachine element. A micromachine element is a miniature moveable structure, such as a bridge, cantilevered beam, suspended mass, membrane or capacitive element, which is supported over a cavity as is well known to those of skill in the art.

Micromachine chip 402 further includes a plurality of bond pads 406 on front surface 402F of micromachine chip

402. In this embodiment, bond pads 406 are directly adjacent to at least two of the plurality of sides 402S of micromachine chip 402, preferably opposite one another. For example, bond pads 406 are formed along a first side 402S1 and also along a second side 402S2 opposite first side 402S1 of the plurality of sides 402S.

Bond pads 406 are connected to the internal circuitry of micromachine chip 402. In order to ensure that maximum cost efficiency is attained in the manufacturing process, width W1 of micromachine chip 402 is the minimum width that can properly support micromachine area 404 and bond pads 406. By minimizing the material required to form micromachine chip 402, the associated costs are similarly minimized.

Micromachine chip 402 is mounted to a substrate 408. Illustratively, substrate 408 is ceramic, printed circuit board, thermoplastic and/or tape although other materials are used in other embodiments. Formed on an upper, e.g., first, surface 408U of substrate 408 are a plurality of electrically conductive traces 410. Traces 410 are sometimes called capture pads. Bond pads 406 are electrically and physically connected to corresponding traces 410 by corresponding electrically conductive bumps 412.

Traces 410 are electrically connected to corresponding electrically conductive vias 414, which extend from upper surface 408U to a lower, e.g., second, surface 408L of substrate 408. Vias 414 are electrically connected to corresponding electrically conductive traces 416 on lower surface 408L of substrate 408. Formed on traces 416 are corresponding electrically conductive pads 418, sometimes called capture pads. Formed on pads 418 are corresponding electrically conductive interconnection balls 420 such as solder balls. Interconnection balls 420 are used to electrically connect package 400 to a larger substrate (not shown) such as a printed circuit mother board.

To illustrate, a first bond pad 406A of the plurality of bond pads 406 is electrically connected to a first trace 410A of the plurality of traces 410 by a first bump 412A of the plurality of bumps 412. Trace 410A is electrically connected to a first via 414A of the plurality of vias 414. Via 414A is electrically connected to a first trace 416A of the plurality of traces 416. A first pad 418A of the plurality of pads 418 is formed on trace 416A. Formed on pad 418A is a first interconnection ball 420A of the plurality of interconnection balls 420.

As set forth above, an electrically conductive pathway between bond pad 406A and interconnection ball 420A is formed by bump 412A, trace 410A, via 414A, trace 416A and pad 418A. The other bond pads 406, bumps 412, traces 410, vias 414, traces 416, pads 418 and interconnection balls 420 are electrically connected to one another in a similar fashion so are not discussed further to avoid detracting from the principals of the invention.

Although a particular electrically conductive pathway between bond pad 406A and interconnection ball 420A is described above, in light of this disclosure, it is understood that other electrically conductive pathways can be formed. For example, substrate 408 is a multi-layered laminate substrate and, instead of straight-through vias 414, a plurality of electrically conductive traces on various layers in substrate 408 are interconnected by a plurality of electrically conductive vias to form the electrical interconnections between traces 410 and 416.

As a further example, vias 414 extend along sides 408S of substrate 408 and traces 410 and 416 extend to sides 408S. As another alternative, interconnection balls 420 are distributed in an array format to form a ball grid array (BGA) type package. Alternatively, interconnection balls 420 are not formed, e.g., to form a metal land grid array (LGA) type package or a leadless chip carrier (LCC) type package. As a further alternative, upper surface 408U and/or lower surface 408L of substrate 408 includes a solder mask(s) in a conventional manner.

Further, in one embodiment, pads 418 are not formed such that interconnection balls 420 are formed directly on traces 416. In accordance with this embodiment, traces 416 are sometimes called capture pads. As a further alternative, contact metallizations (not shown) are interposed between various electrical conductors of package 400, e.g., between bumps 412 and traces 410. Other electrically conductive pathway modifications will be obvious to those of skill in the art.

A package body 424, sometimes called a bead, contacts a periphery of micromachine chip 402 and secures micromachine chip 402 to substrate 408. Generally, package body 424 contacts sides 402S of micromachine chip 402 and upper surface 408U of substrate 408. Typically, package body 424 is an electrical insulator. In one embodiment, package body 424 is an epoxy dispense material such as Hysol 4323, 4450, 4451.

In this embodiment, package body 424 extends slightly under micromachine chip 402 between front surface 402F of micromachine chip 402 and upper surface 408U of substrate 408. Package body 424 contacts the periphery of front surface 402F and encloses bond pads 406 and bumps 412. However, package body 424 only extends to the periphery of micromachine area 404 and does not extend to contact micromachine area 404.

To the extent that micromachine chip 402 has a different thermal coefficient of expansion than substrate 408, package body 424 insures that micromachine chip 402 does not become dismounted from substrate 408 as a result of differential thermal expansion between micromachine chip 402 and substrate 408.

Further, package body 424 forms a seal between the periphery of micromachine chip 402 and substrate 408. Thus, micromachine chip 402, package body 424, and substrate 408 define a cavity 426, which is sealed. In particular, micromachine area 404 is located within cavity 426, which is sealed to protect micromachine area 404 against external moisture, dust and contamination. Further, locating micromachine area 404 within cavity 426 insures that the micromachine element within micromachine area 404 moves freely and functions properly.

Recall that in the prior art, a cap was mounted over the micromachine area. Advantageously, by inverting micromachine chip 402 and coupling bond pads 406 of micromachine chip 402 to traces 410 of substrate 408 by bumps 412, i.e., by mounting micromachine chip 402 as a flip chip to substrate 408, the requirement for the cap utilized in the prior art is eliminated. By eliminating the cap, the materials and labor associated with manufacturing and installing the cap are also eliminated. Further, since the requirement for the cap is eliminated, the requirement for grounding the cap is also eliminated.

In package 400, package body 424 contacts sides 402S, e.g., sides 402S1 and 402S2, of micromachine chip 402 and does not contact rear surface 402R of micromachine chip 402 opposite front surface 402F. By restricting package body 424 in this way, package 400 has a minimal thickness and can readily be utilized in areas having strict component height requirements.

Figure 5:
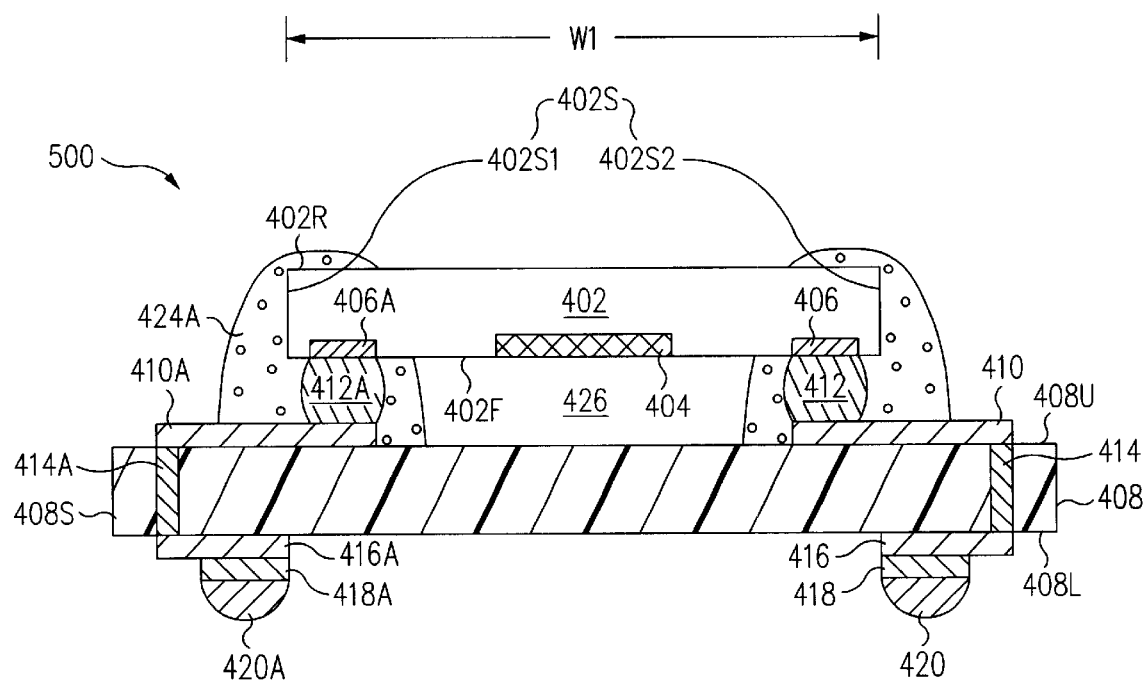
FIG. 5 is a cross-sectional view of a micromachine package in accordance with an alternative embodiment of the present invention.

FIG. 5 is a cross-sectional view of a micromachine package 500 (hereinafter package 500) in accordance with an alternative embodiment of the present invention. Package 500 of FIG. 5 is substantially similar to package 400 of FIG. 4 and only the significant differences are discussed below Referring now to FIG. 5, package body 424A contacts a periphery of front surface 402F and sides 402S of micromachine chip 402. However, in accordance with this embodiment, package body 424A also contacts a periphery of rear surface 402R of micromachine chip 402. In this manner, package body 424A enhances the environmental and physical protection of micromachine area 404 and the reliability of package 500.

As used herein, the periphery of front surface 402F is the region of front surface 402F directly adjacent to sides 402S of micromachine chip 402. Similarly, the periphery of rear surface 402R is the region of rear surface 402R directly adjacent to sides 402S of micromachine chip 402. Sides 402S extend between front surface 402F and rear surface 402R.

Figure 6:
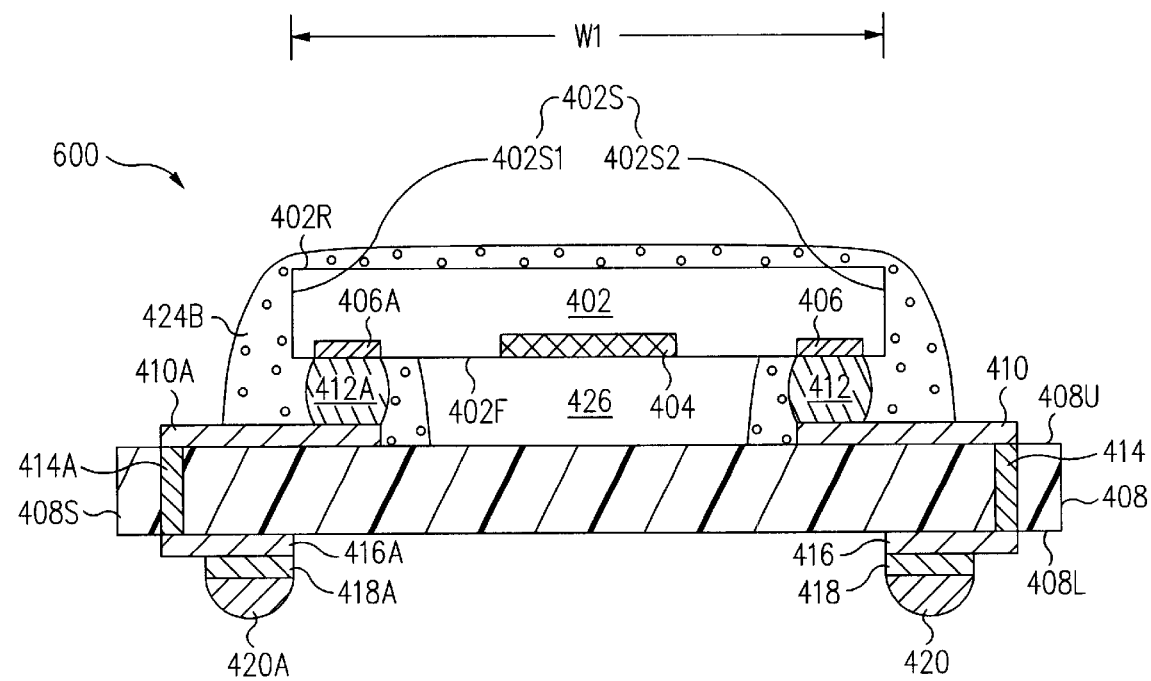
FIG. 6 is a cross-sectional view of a micromachine package in accordance with yet another alternative embodiment of the present invention.

FIG. 6 is a cross-sectional view of a micromachine package 600 (hereinafter package 600) in accordance with yet another alternative embodiment of the present invention. Package 600 of FIG. 6 is substantially similar to package 400 of FIG. 4 and only the significant differences are discussed below Referring now to FIG. 6, package body 424B contacts the periphery of front surface 402F and sides 402S of micromachine chip 402. However, in accordance with this embodiment, package body 424B also entirely contacts rear surface 402R of micromachine chip 402 and thus encloses micromachine chip 402. In this manner, package body 424B maximizes the environmental and physical protection of micromachine area 404 and the reliability of package 600.

FIG. 7 is a cross-sectional view of an array 700 of packages 400 during assembly in accordance with the present invention. Array 700 includes a micromachine substrate 710. Micromachine substrate 710 includes a plurality of individual substrates 408 integrally connected together in an array format, e.g., a 2×2, 3×3, . . . n×m format. Each of substrates 408 is delineated by a singulation street 712, which is located between adjacent substrates 408. For example, a first singulation street 712A of the plurality of singulation streets 712 delineates a first substrate 408A of the plurality of substrates 408 from a second substrate 408B of the plurality of substrates 408. The other substrates 408 are similarly delineated from adjacent substrates 408 by corresponding singulation streets 712.

Substrates 408 include traces 410 on upper surfaces 408U of substrates 408. Substrates 408 also include vias 414 extending through substrates 408 and traces 416 on lower surfaces 408L of substrates 408. Pads 418 are on traces 416. In one embodiment, metallized vias along singulation streets 712 are combined with conductive lands to provide LCC footprints.

As shown in FIG. 7, micromachine chips 402 are attached to micromachine substrate 710. For example, a first micromachine chip 402A of the plurality of micromachine chips 402 is attached to first substrate 408A by a first set of bumps 412B of the plurality of bumps 412. The other micromachine chips 402 are attached to corresponding substrates 408 in a similar manner. Generally, micromachine chips 402 are attached to corresponding substrates 408 of micromachine substrate 710 by bumps 412.

To attach micromachine chips 402, each micromachine chip 402 is aligned with micromachine substrate 710 using any one of a number of alignment techniques, e.g., micromachine chips 402 are optically or mechanically aligned. Micromachine chips 402 are attached to micromachine substrate 710 using any one of a number of techniques. For example, bumps 412, e.g., solder, are formed on bond pads 406 of micromachine chips 402 or, alternatively, on traces 410. In accordance with this embodiment, bumps 412 are reflowed, i.e., melted and solidified, to attach bond pads 406 to traces 410. In one embodiment, substrate 408 is ceramic and bumps 412 are formed of a high-temperature solder as those of skill in the art will understand. In alternative embodiments, substrate 408 is printed circuit board, thermoplastic or tape and bumps 412 are formed of a low-temperature solder as those of skill in the art will understand.

Alternatively, bond pads 406 of micromachine chips 402 are attached to traces 410 by bumps 412 formed of an electrically conductive epoxy paste or film, which is thermally or optically cured. As a further alternative, bond pads 406 of micromachine chips 402 are attached to traces 410 by thermal or thermosonic bonding of bumps 412 formed of gold formed on bond pads 406, or alternatively, on traces 410. Generally, bond pads 406 of micromachine chips 402 are physically connected to traces 410. In light of this disclosure, those of skill in the art will understand that other methods of attaching micromachine chips 402 to micromachine substrate 710 can be used.

Advantageously, only micromachine chips 402 which have been tested and found to operate correctly are attached to micromachine substrate 710. In this manner, waste of substrates 408 is avoided and labor associated with attaching micromachine chips 402, which are defective, thereto is saved. This, in turn, minimizes the total average cost associated with the fabrication of each batch of packages 400.

Recall that in the prior art, a single lid 30 was attached to a plurality of micromachine chips 12 while still in wafer form (FIGS. 1, 2A). Thus, in the prior art, a cap 42 was attached to each micromachine chip 12 even if the micromachine chip was defective. Accordingly, caps 42 and labor associated with attaching caps 42 to the defective micromachine chips 12 were wasted in the prior art. Since this waste of the prior art is eliminated, package 400 in accordance with the present invention is less expensive to manufacture than a micromachine package of the prior art.

Figure 8:
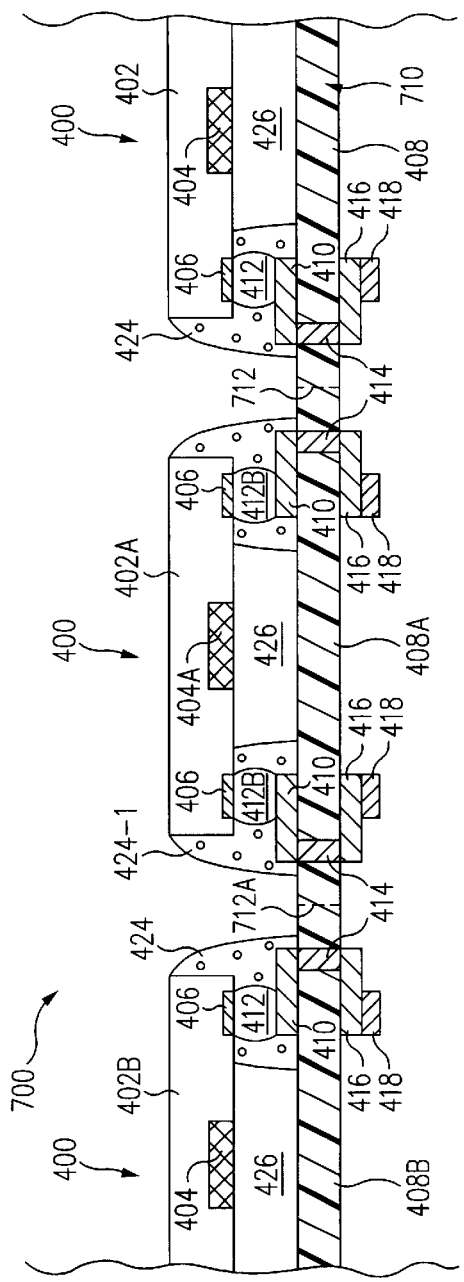
FIG. 8 is a cross-sectional view of the array of FIG. 7 at a later stage of assembly.

FIG. 8 is a cross-sectional view of array 700 of FIG. 7 at a later stage of assembly in accordance with this embodiment of the present invention. As shown in FIG. 8, package bodies 424 are formed around the peripheries of micromachine chips 402. To illustrate, a first package body 424-1 of the plurality of package bodies 424 is formed around a periphery of first micromachine chip 402A. The other package bodies 424 are similarly formed around the peripheries of the other micromachine chips 402.

Of importance, package bodies 424 are formed in a manner which prevents package bodies 424 from completely filling the spaces between micromachine chips 402 and micromachine substrate 710. More particularly, package bodies 424 do not contact micromachine areas 404 of micromachine chips 402.

Generally, package bodies 424 are formed from a limited flow material, e.g., liquid encapsulant. More particularly, a limited flow material is dispensed around micromachine chips 402 and drawn slightly between micromachine chips 402 and substrates 408 by capillary force. The limited flow material is cured to form package bodies 424.

To illustrate, a limited flow material is dispense around micromachine chip 402A and drawn slightly between micromachine chip 402A and substrate 408A. The limited flow material is then cured to form package body 424-1. For example, an epoxy dispense material, e.g., liquid encapsulant, such as Hysol 4323, 4450, 4451 is applied using a needle dispenser and then cured to form package bodies 424.

Figure 9:
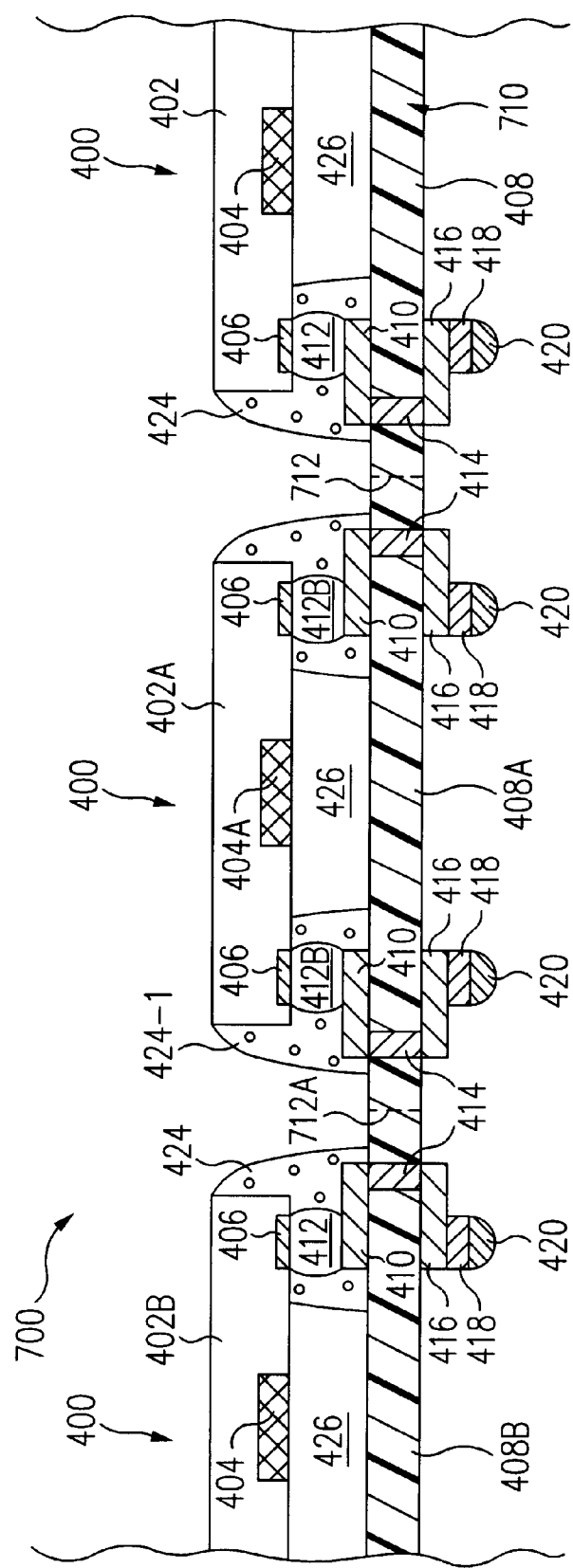
FIG. 9 is a cross-sectional view of the array of FIG. 8 at a later stage of assembly.

FIG. 9 is a cross-sectional view of array 700 of FIG. 8 at a later stage of assembly in accordance with this embodiment of the present invention. As shown in FIG. 9, micromachine substrate 710 is populated with interconnection balls 420 on corresponding pads 418. Array 700 is singulated into a plurality of individual packages 400 (FIG. 4) by singulating micromachine substrate 710 along singulation streets 712. Singulation can be accomplished using any one of a number of conventional singulation techniques, e.g., by laser cutting or mechanical sawing through micromachine substrate 710 along singulation streets 712. Array 700 can also be singulated before interconnection balls 420 are populated, e.g., after the assembly shown in FIG. 8 is completed.

By forming a plurality of packages 400 simultaneously, several advantages are realized. One advantage is that it is less labor intensive to handle and process a plurality of packages 400 simultaneously rather than to handle and process each package 400 on an individual basis. By reducing labor, the costs associated with each package 400 is minimized. However, in light of this disclosure, those of skill in the art will recognize that packages 400 can also be manufactured on an individual basis if desired.

This application is related to Glenn, co-filed and commonly assigned U.S. patent application Ser. No. 09/608,502, now U.S. Pat. No. 6,214,644, issued Apr. 10, 2001, entitled "FLIP-CHIP MICROMACHINE PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A structure comprising:
   a micromachine chip having a micromachine area and a bond pad, said micromachine area and said bond pad being on a first surface of said micromachine chip;
   a substrate having a first trace formed on a first surface of said substrate;
   a bump electrically connecting said bond pad to said first trace; and
   a package body, wherein said package body extends between said first surface of said micromachine chip and said first surface of said substrate.

2. The structure of claim 1 wherein said micromachine chip is mounted as a flip chip to said substrate.

3. The structure of claim 1, wherein said micromachine chip, said package body, and said substrate define a cavity.

4. The structure of claim 3 wherein said micromachine area is located within said cavity.

5. The structure of claim 3 wherein said micromachine chip further comprises a second surface and sides extending between said first surface of said micromachine chip and said second surface of said micromachine chip, said package body contacting said sides.

6. The structure of claim 5 wherein said package body contacts a periphery of said second surface of said micromachine chip directly adjacent said sides.

7. The structure of claim 6 wherein said package body entirely contacts said second surface of said micromachine chip.

8. The structure of claim 3 wherein said package body encloses said bond pad and said bump.

9. The structure of claim 1 wherein said package body extends to a periphery of said micromachine area.

10. The structure of claim 1 wherein said substrate further comprises a second trace formed on a second surface of said substrate, said second trace being electrically connected to said first trace.

11. The structure of claim 10 further comprising a via extending from said first surface of said substrate to said second surface of said substrate, said second trace being electrically connected to said first trace by said via.

12. The structure of claim 10 further comprising a pad on said second trace.

13. The structure of claim 12 further comprising an interconnection ball on said pad.

14. The structure of claim 1 wherein said substrate is one of a plurality of substrates integrally connected together.

15. The structure of claim 1 wherein said micromachine area comprises a micromachine element.

16. The structure of claim 15 wherein said micromachine element comprises a miniature movable structure.

17. A structure comprising:
   a micromachine chip having a micromachine area on a first surface of said micromachine chip;
   a substrate having a first surface; and
   a package body securing said micromachine chip to said substrate, wherein said package body extends between said first surface of said micromachine chip and said first surface of said substrate, and wherein said micromachine chip, said package body, and said substrate define a cavity, said micromachine area being located within said cavity.

18. The structure of claim 17 wherein said micromachine area comprises a micromachine element.

19. The structure of claim 18 wherein said micromachine element comprises a miniature movable structure.

20. A structure comprising:
   a micromachine chip comprising:
      a first surface;
      a micromachine element comprising a miniature movable structure on said first surface; and
      bond pads on said first surface;
   a substrate having traces formed on a first surface of said substrate;
   bumps electrically and physically connecting said bond pads to said traces; and
   a bead extending between and forming a seal between a periphery of said first surface of said micromachine chip and said first surface of said substrate.

21. A structure comprising:
   a micromachine chip having a micromachine area and a bond pad on a first surface of said micromachine chip, said micromachine chip having a second surface opposite said first surface of said micromachine chip;
   a substrate having a first trace formed on a first surface of said substrate;
   a bump electrically connecting said bond pad to said first trace; and
   a package body extending between said first surface of said micromachine chip and said first surface of said substrate, and wherein said second surface of said micromachine chip is exposed.

22. The structure of claim 21 wherein said micromachine chip has sides extending between said first surface and said second surface of said micromachine chip, and wherein at least a portion of said sides of said micromachine chip is in contact with said package body.

* * * * *